(12) United States Patent
Hong

(10) Patent No.: US 8,759,890 B2
(45) Date of Patent: Jun. 24, 2014

(54) SEMICONDUCTOR DEVICE WITH BURIED BIT LINES AND METHOD FOR FABRICATING THE SAME

(71) Applicant: SK hynix Inc., Gyeonggi-do (KR)

(72) Inventor: Ki-Ro Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/938,796

(22) Filed: Jul. 10, 2013

(65) Prior Publication Data
US 2013/0292792 A1    Nov. 7, 2013

Related U.S. Application Data

(62) Division of application No. 12/831,547, filed on Jul. 7, 2010, now Pat. No. 8,507,342.

(30) Foreign Application Priority Data

Jun. 4, 2010   (KR) ................. 10-2010-0053001

(51) Int. Cl.
*H01L 27/108*    (2006.01)

(52) U.S. Cl.
USPC .......................................... 257/296

(58) Field of Classification Search
USPC ................... 257/296, 534, 270, 301
See application file for complete search history.

(56) References Cited

U.S. PATENT DOCUMENTS 6,130,470 A * 10/2000 Selcuk ................ 257/534
2005/0056873 A1 * 3/2005 Sommer et al. ............ 257/296

\* cited by examiner

*Primary Examiner* — Thao P Le
(74) *Attorney, Agent, or Firm* — IP & T Group LLP

(57) ABSTRACT

A semiconductor device includes active regions separated by a trench, a separation layer dividing the trench, and buried bit lines buried in the trench with the separation layer interposed between the buried bit lines.

15 Claims, 14 Drawing Sheets

SEMICONDUCTOR DEVICE WITH BURIED BIT LINES AND METHOD FOR FABRICATING THE SAME

CROSS-REFERENCE TO RELATED APPLICATIONS

This application is a division of U.S. patent application Ser. No. 12/831,547 filed on Jul. 7, 2010, which claims priority of Korean Patent Application No. 10-2010-0053001, filed on Jun. 4, 2010. The disclosure of each of the foregoing application is incorporated herein by reference in its entirety.

BACKGROUND OF THE INVENTION

Exemplary embodiments of the present invention relate to a semiconductor device fabricating method, and more particularly, to a semiconductor device with buried bit lines and a method for fabricating the same.

For high integration of a memory device such as a DRAM, memory cells having a $4F^2$ (here F is a minimum feature size) structure are desirable, where such cells may increase a net die compared to cells having $8F^2$ and $6F^2$ structures.

A cell having the $4F^2$ structure may be a three-dimensional cell which includes a vertical transistor and a buried bit line (BBL).

FIGS. 1A and 1B are a plan view and a cross-sectional view illustrating a conventional semiconductor device. FIG. 1A is a cross-sectional view of the conventional semiconductor device along the line A-A' in FIG. 1B.

Referring to FIGS. 1A and 1B, a plurality of pillar-shaped active regions 12 are formed on a substrate 11. The active regions 12 are uniformly spaced from one another by trenches 13. A pad layer 14 and a hard mask layer 15 are deposited on the active regions 12. Buried bit lines BBL1, BBL2, BBL3 and BBL4 are formed in the trenches 13. Each of junctions 16 to serve as source regions or drain regions is formed on a portion of a sidewall of each of the active regions 12. The buried bit lines BBL1, BBL2, BBL3 and BBL4 and the junctions 16 are electrically connected through side contacts 17. Each of the side contacts 17 may be formed on the portion of just one sidewall of each of the active regions 12. This is called an OSC (one side contact) structure. The reference numerals 18 and 19 designate dielectric layers such as liner layers or any other reasonably suitable dielectric layers.

In the semiconductor device shown in FIGS. 1A and 1B, due to the fact that the side contacts 17 are used at zones where the buried bit lines BBL1, BBL2, BBL3 and BBL4 and the active regions 12 contact each other, ohmic contacts may be formed. The side contacts 17 and the junctions 16 are formed on a portion of a sidewall of each of the active regions 12. The junctions 16 are also called side junctions.

However, in the conventional art, in using an etching process for exposing a sidewall of each of the active regions 12 to form the junctions 16 and the side contacts 17, it is difficult to align appropriate mask(s). Further, since the sidewall of each of the active regions 12 is exposed through the etching process, it is difficult to uniformly expose the portion of the sidewall. Accordingly, processing difficulties increase, and it is difficult to secure uniform characteristics of the side contacts 17 and the junctions 16. As a result, the electrical characteristics of the semiconductor device may be degraded.

SUMMARY OF THE INVENTION

An embodiment of the present invention is directed to a semiconductor device which may ensure uniformity of side contacts and junctions, secure a margin of a mask process, and stabilize electrical characteristics when forming three-dimensional cells, and a method for fabricating the same.

In accordance with an embodiment of the present invention, a semiconductor device includes: active regions separated by a trench; a separation layer dividing the trench; and buried bit lines buried in the trench with the separation layer interposed between the buried bit lines. The semiconductor device may further include: a junction formed on each sidewall of the active regions and connected with a respective one of the buried bit lines; and a side contact formed between each of the junctions and a respective one of the buried bit lines.

In accordance with another embodiment of the present invention, a semiconductor device includes: a plurality of active regions separated by alternating ones of first trenches and second trenches, wherein the second trenches have a width smaller than that of the first trenches; separation layers for dividing the first trenches, respectively; buried bit lines buried in each of the first trenches with the separation layers interposed between the bit lines of the trench; and junctions formed in the active regions and connected with the buried bit lines.

In accordance with another embodiment of the present invention, a method for fabricating a semiconductor device includes: etching a substrate and defining a trench which separates active regions; forming a liner layer which has contact zones for exposing portions of sidewalls of the active regions; and forming junctions on the exposed portions of the sidewalls of the active regions. In accordance with another embodiment of the present invention, a method for fabricating a semiconductor device includes: etching a substrate and defining a trench which separates active regions; forming a separation layer which divides the trench into portions; and forming buried bit lines which are each buried in the respective divided portion of the trench.

In accordance with another embodiment of the present invention, a method for fabricating a semiconductor device includes: etching a substrate and forming active regions which are separated by alternating ones of first trenches and second trenches, wherein the second trenches have a width smaller than that of the first trenches; forming a junction on a sidewall of each of the active regions; forming separation layers dividing the first trenches, respectively; and forming buried bit lines which are buried in each of the first trenches with the respective separation layer interposed between the buried bit lines and are connected with the respective junctions.

DESCRIPTION OF SPECIFIC EMBODIMENTS

Figure 1A:
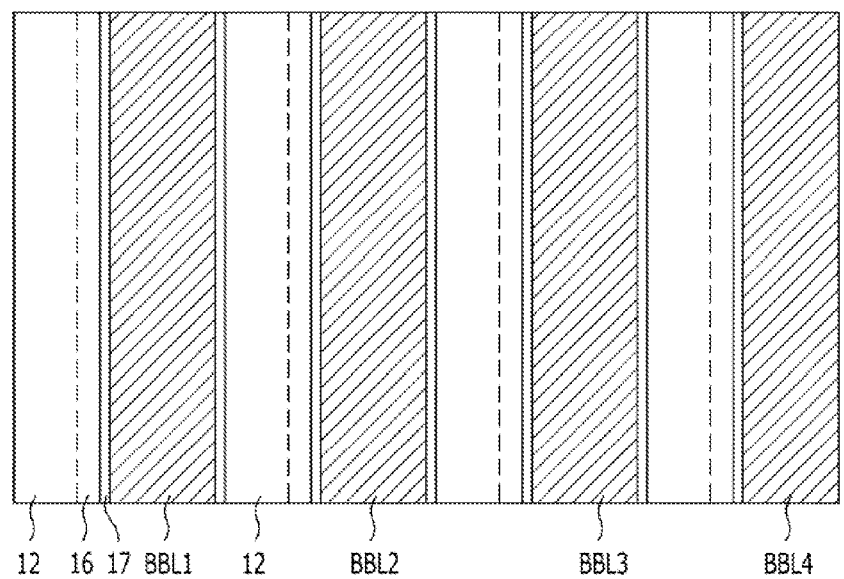
FIGS. 1A and 1B are a plan view and a cross-sectional view illustrating a conventional semiconductor device.
Figure 1B:
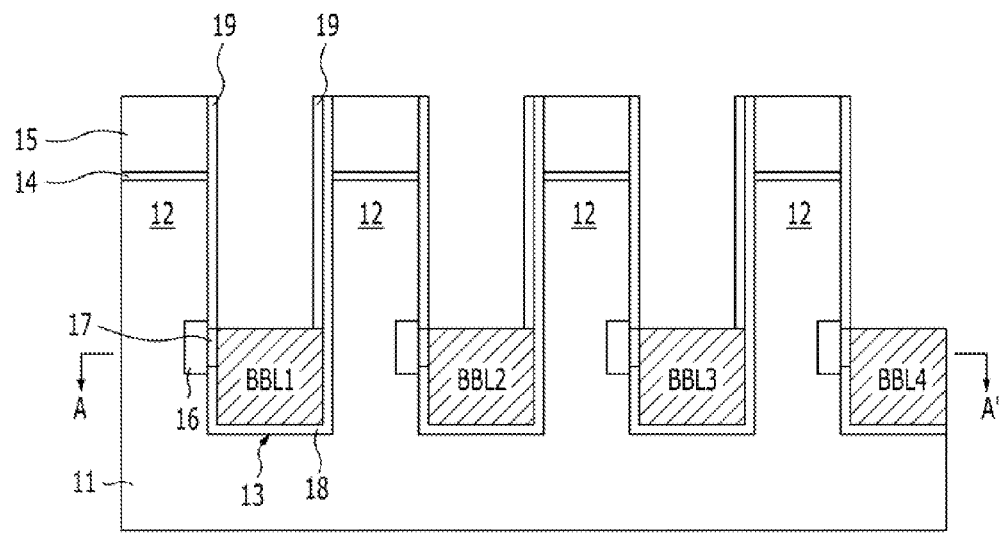

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
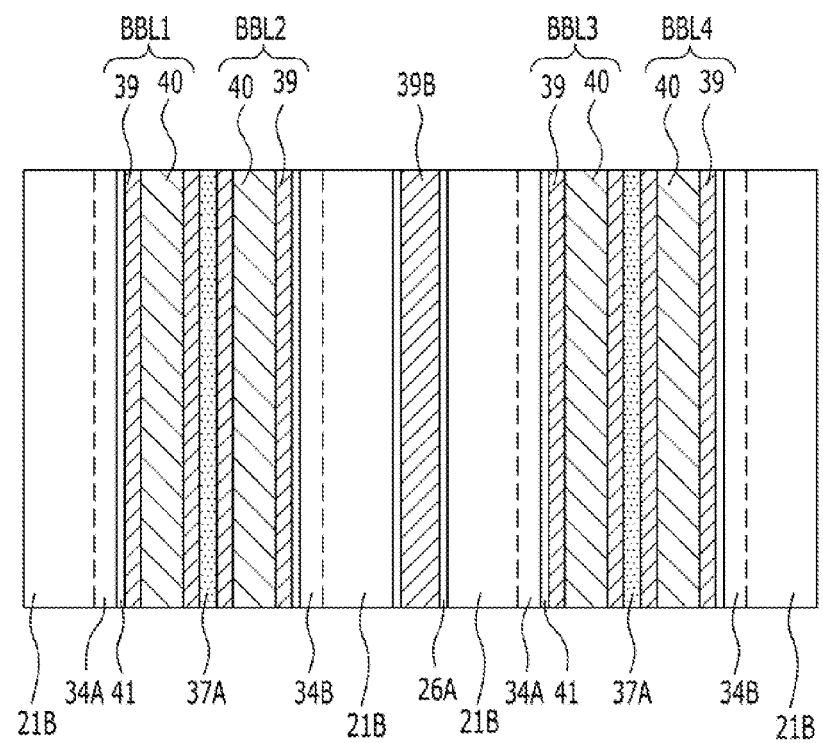
FIGS. 2A and 2B are a plan view and a cross-sectional view illustrating a semiconductor device in accordance with an embodiment of the present invention.
Figure 2B:
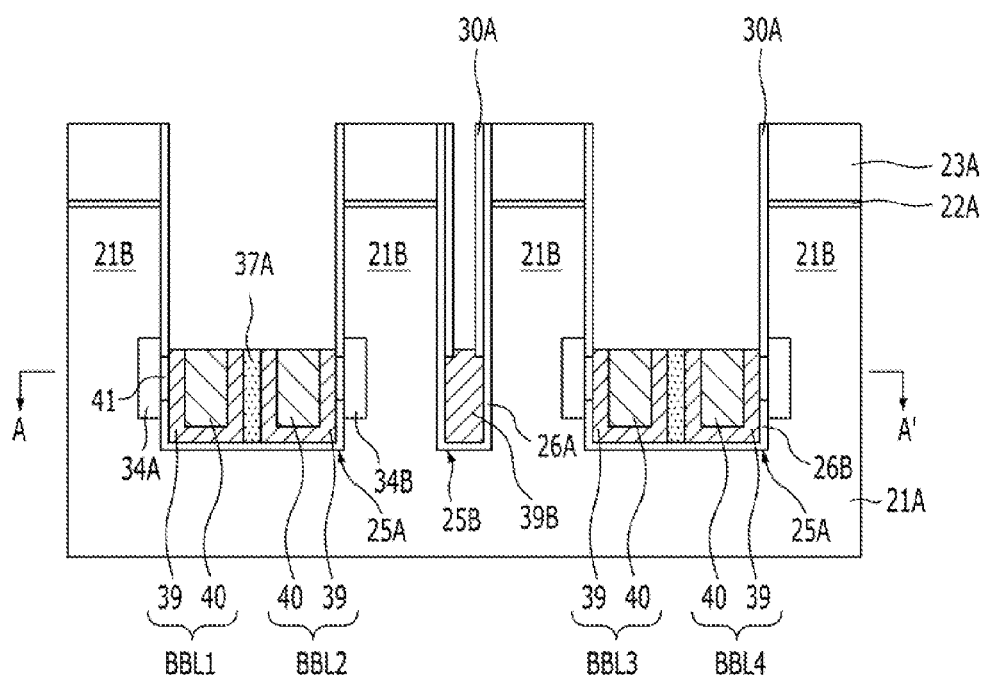

FIGS. 2A and 2B are a plan view and a cross-sectional view illustrating a semiconductor device in accordance with an embodiment of the present invention. FIG. 2A is a cross-sectional view of the semiconductor device along the line A-A' in FIG. 2B.

Referring to FIGS. 2A and 2B, a plurality of active regions 21B are formed on a substrate 21A. The plurality of active regions 21B are formed to be separated from one another by one of a first trench 25A and a second trench 25B alternately, where the second trench 25B has a width smaller than that of the first trench 25A. The respective active regions 21B may have the same width.

Buried bit lines BBL1, BBL2, BBL3 and BBL4 are buried in first trenches 25A and each is connected to an active region 21B. A separation layer 37A is formed between two buried bit lines BBL1 and BBL2, and between two buried bit lines BBL3 and BBL4. Each of the buried bit lines BBL1 to BBL4 includes a barrier metal 39 and a metal layer 40. While four active regions 21B and four buried bit lines BBL1 to BBL4 are shown for illustration purposes, a number of active regions and a number of buried bit lines may vary. Two adjoining active regions 21B are defined as a pair of active regions 21B.

Two adjoining active regions 21B separated by the first trench 25A define the pair of active regions 21B, where adjoining active regions 21B of neighboring pairs of the active regions 21B are separated by the second trench 25B.

A dummy line 39B is buried in the second trench 25B which has the width smaller than that of the first trench 25A. The dummy line 39B may be the same material as the barrier metal 39. The dummy line 39B is not electrically connected with the active region 21B.

A first junction 34A, which is connected with the buried bit line BBL1 or BBL3, is formed on a portion of a sidewall of one of the pair of active regions 21B. A second junction 34B, which is connected with the buried bit line BBL2 or BBL4, is formed on a portion of the sidewall of the other one of the pair of active regions 21B. The first junction 34A and the second junction 34B may be bilaterally symmetrical with respect to the first trench 25A. For example, the first junction 34A is formed on a portion of a sidewall of the first trench 25A, and the second junction 34B is formed on a portion of the other sidewall of the first trench 25A. Moreover, the buried bit lines are bilaterally symmetrical with respect to the first trench 25A. Side contacts 41 for ohmic contacts are formed between the respective buried bit lines BBL1 to BBL4 and the respective junctions 34A and 34B. The side contacts 41 may include a metal silicide layer.

Pad patterns 22A and hard mask patterns 23A are formed on the respective active regions 21B. A liner layer (e.g., 26A, 26B, and 30A) is formed on the surfaces of both sidewalls of the respective active regions 21B. For example, first liner patterns 26B and second liner patterns 30A are formed. The side contacts 41 are formed between the first liner patterns 26B and the second liner patterns 30A. A first liner layer 26A is formed on the surface of the second trench 25B, and the second liner patterns 30A are formed to cover the first liner layer 26A. The sidewalls of the second trench 25B are not formed with the side contacts 41.

As described above, in the semiconductor device in accordance with an exemplary embodiment of the present invention, the first and second junctions 34A and 34B are formed on the portions of the sidewalls of the active regions 21B, where the sidewalls face each other, and are separated from each other by the first trench 25A, in, for example, a symmetric arrangement. The side contacts 41 are also formed in a symmetric arrangement.

Furthermore, in the semiconductor device in accordance with an exemplary embodiment of the present invention, the active regions 21B are not formed at regular intervals, but are formed at alternating intervals which are defined by the first trench 25A and the second trench 25B having different widths. The active regions 21B separated by the first trench 25A adjoin each other with a wide interval corresponding to the width of the first trench 25A. Conversely, the active regions 21B separated by the second trench 25B adjoin each other with a narrow interval corresponding to the width of the second trench 25B.

Here, even though the plurality of active regions 21B are formed at alternating intervals, a cell area does not increase. For example, the same cell area used for active regions at regular intervals, may be used for forming the plurality of active regions 21B at alternating intervals. More specifically, since the width of the first trench 25A increases but the width of the second trench 25B decreases, the area, in which, for example, four active regions and four buried bit lines are formed, may use the same cell area used for forming active regions at regular intervals.

Figure 3A:
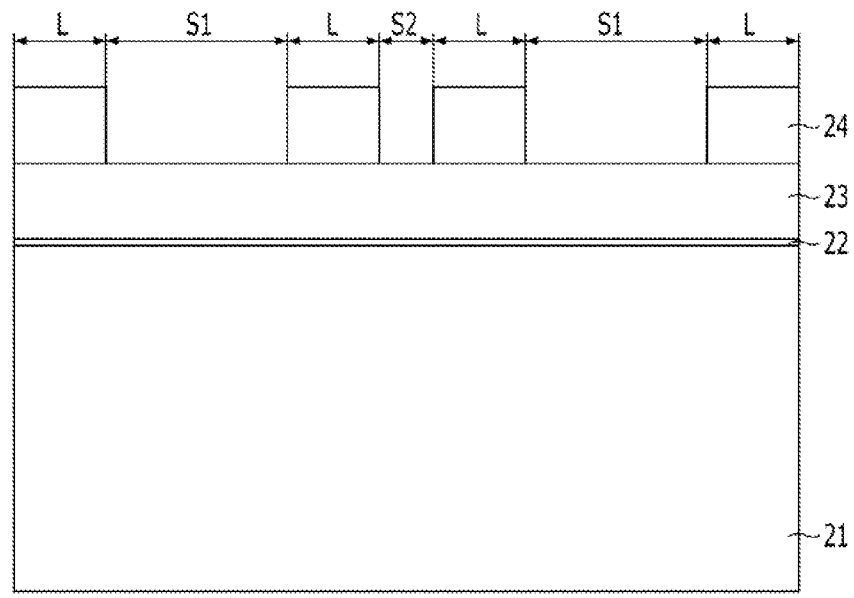
FIGS. 3A to 3Q are cross-sectional views illustrating the processes of a method for fabricating a semiconductor device in accordance with another embodiment of the present invention.
Figure 3B:
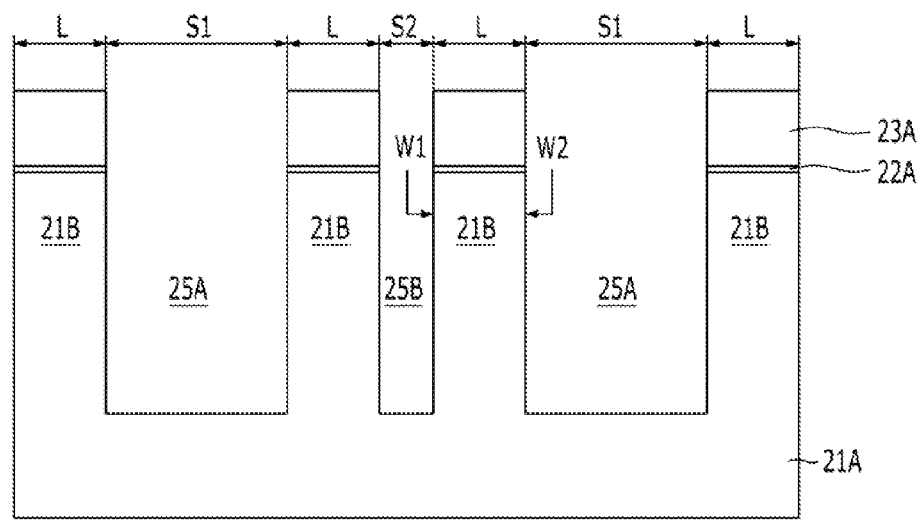
Figure 3C:
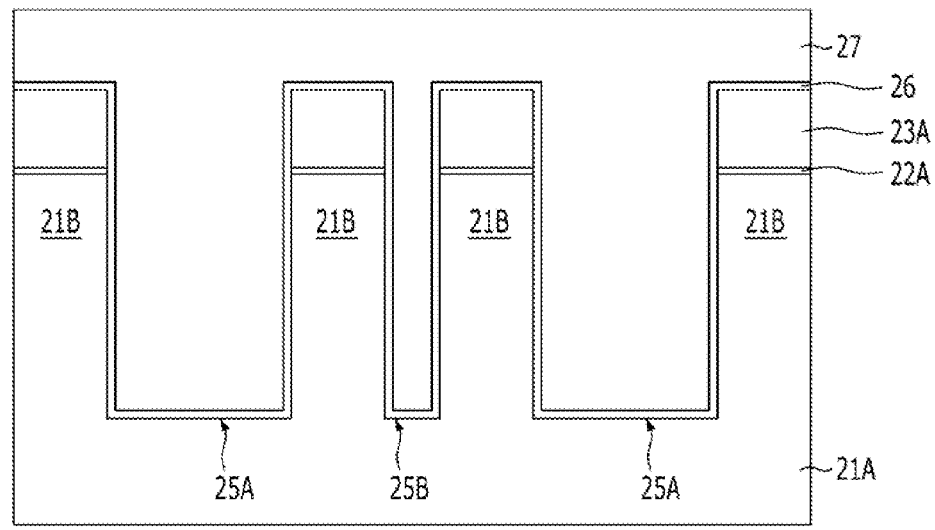
Figure 3D:
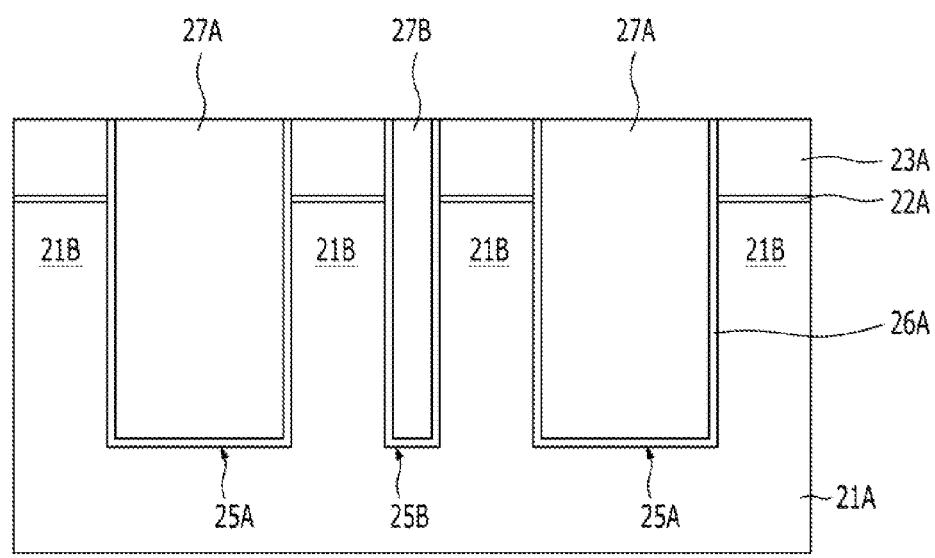
Figure 3E:
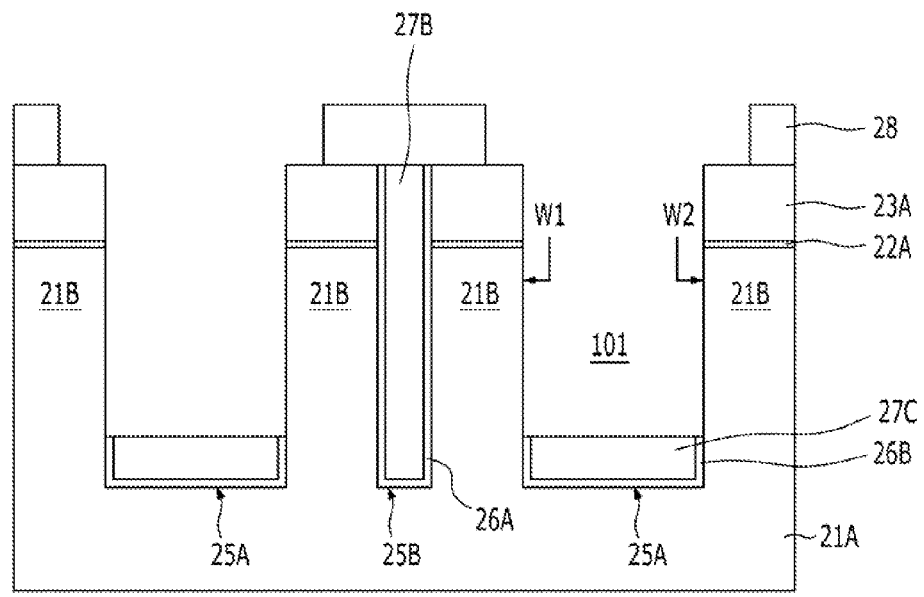
Figure 3F:
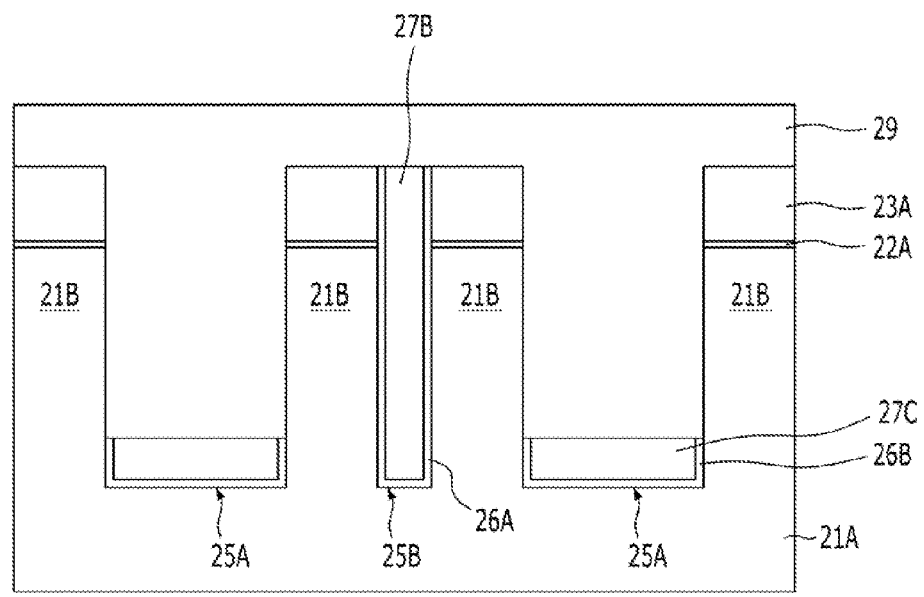
Figure 3G:
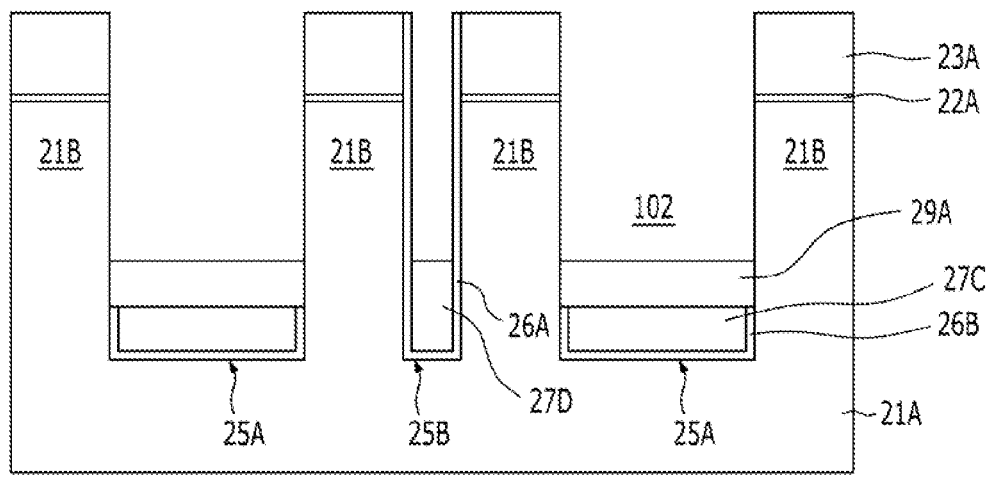
Figure 3H:
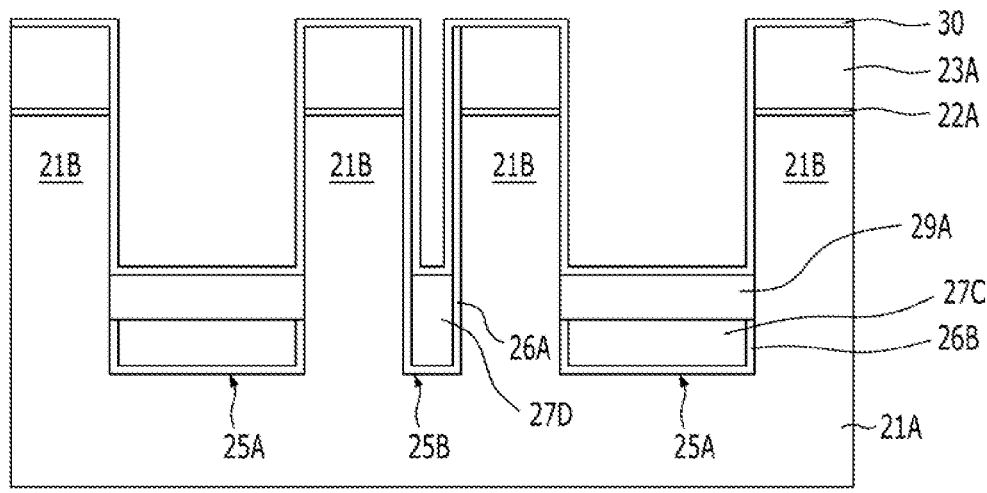
Figure 3I:
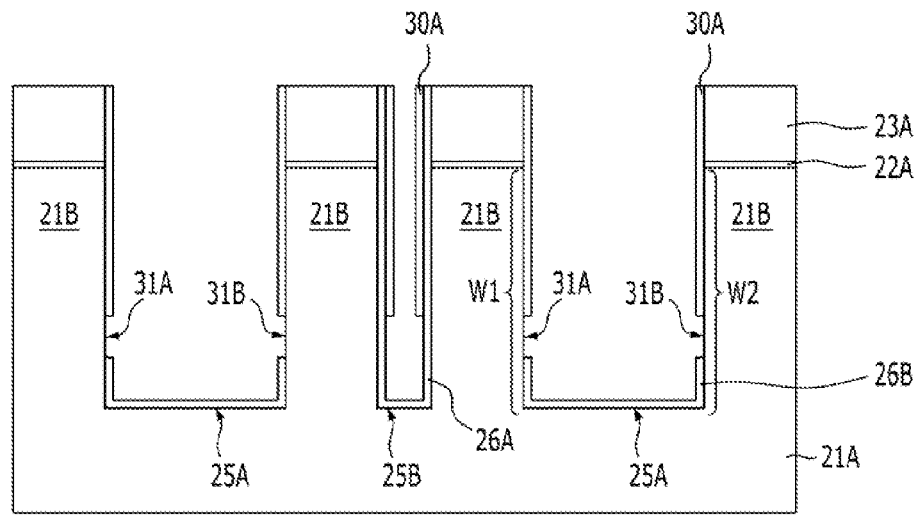
Figure 3J:
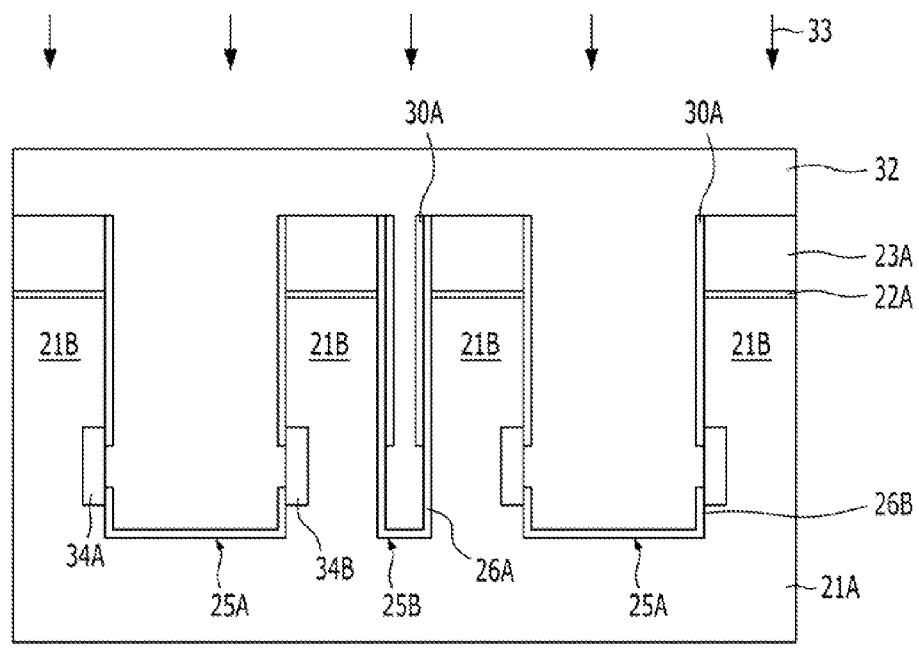
Figure 3K:
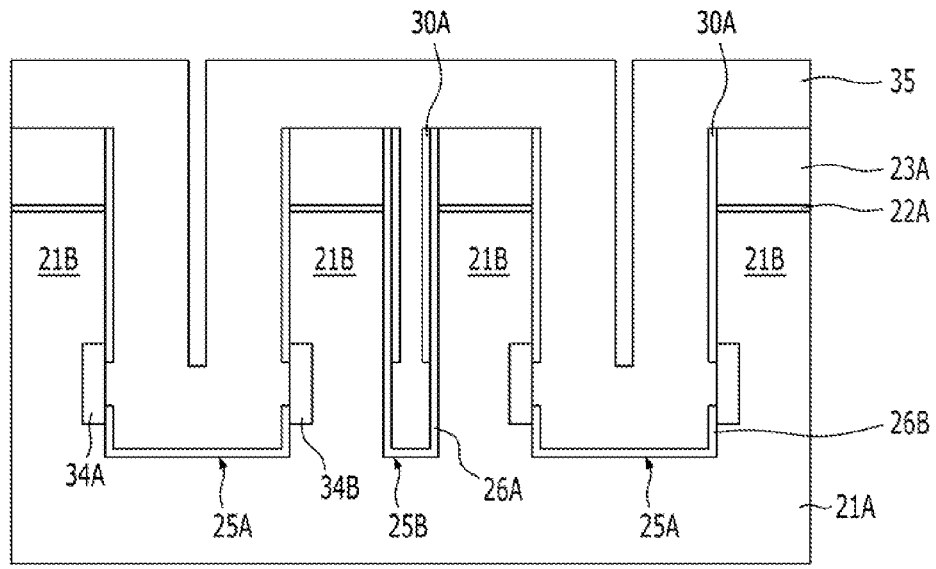
Figure 3L:
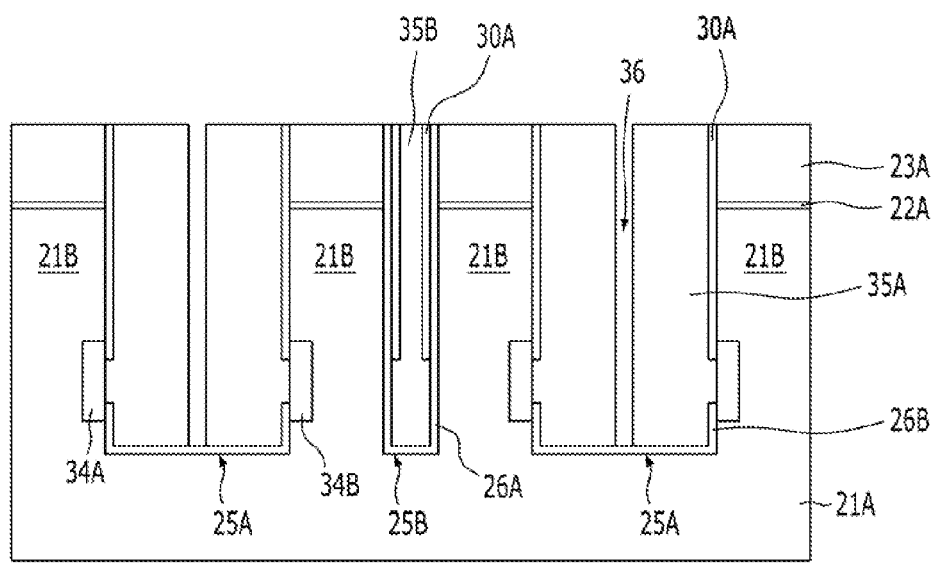
Figure 3M:
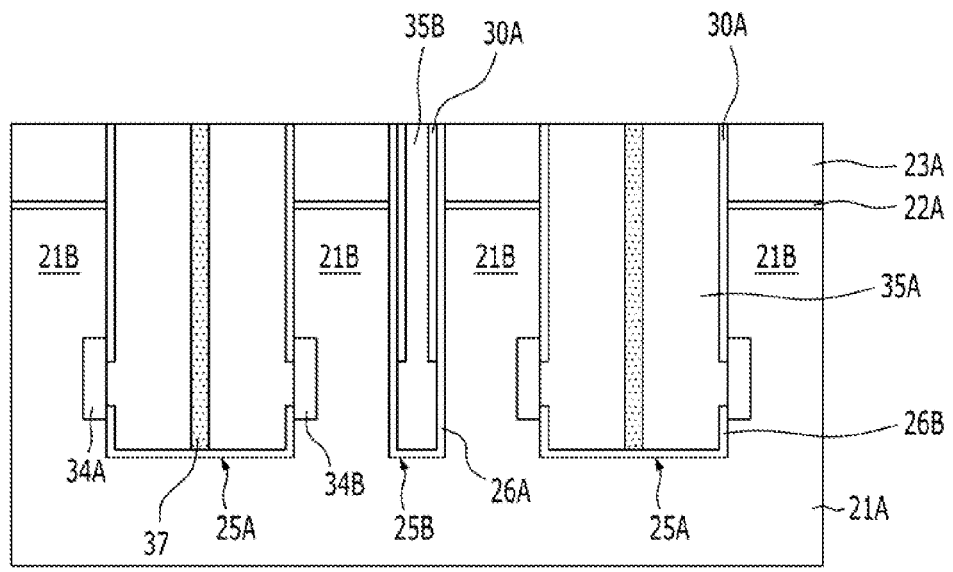
Figure 3N:
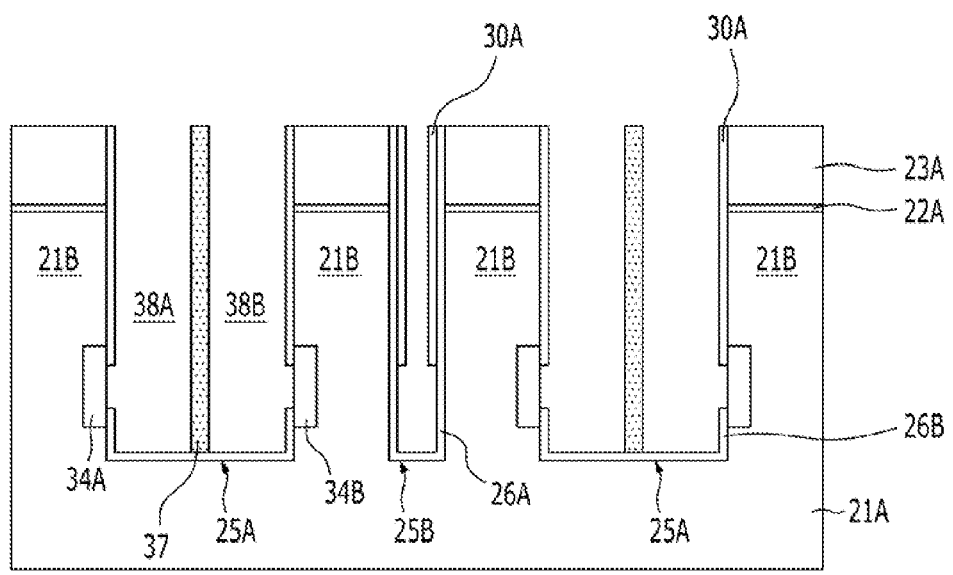
Figure 3O:
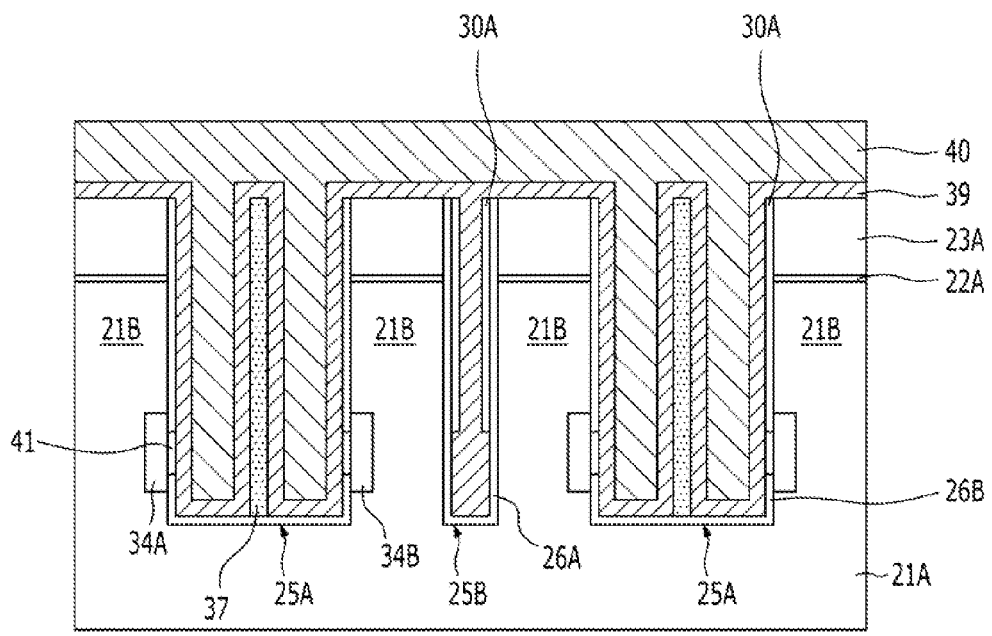
Figure 3P:
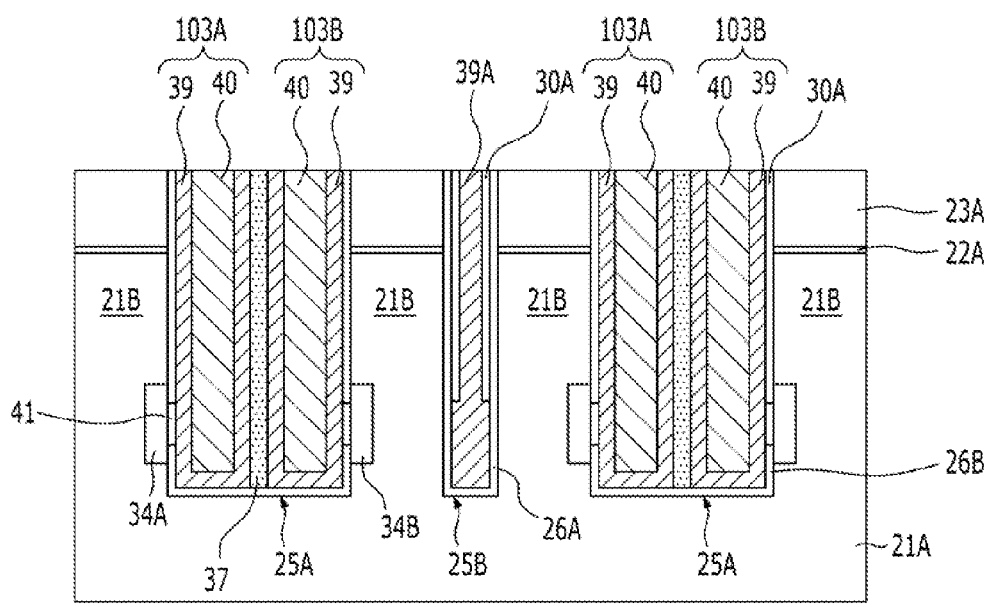
Figure 3Q:
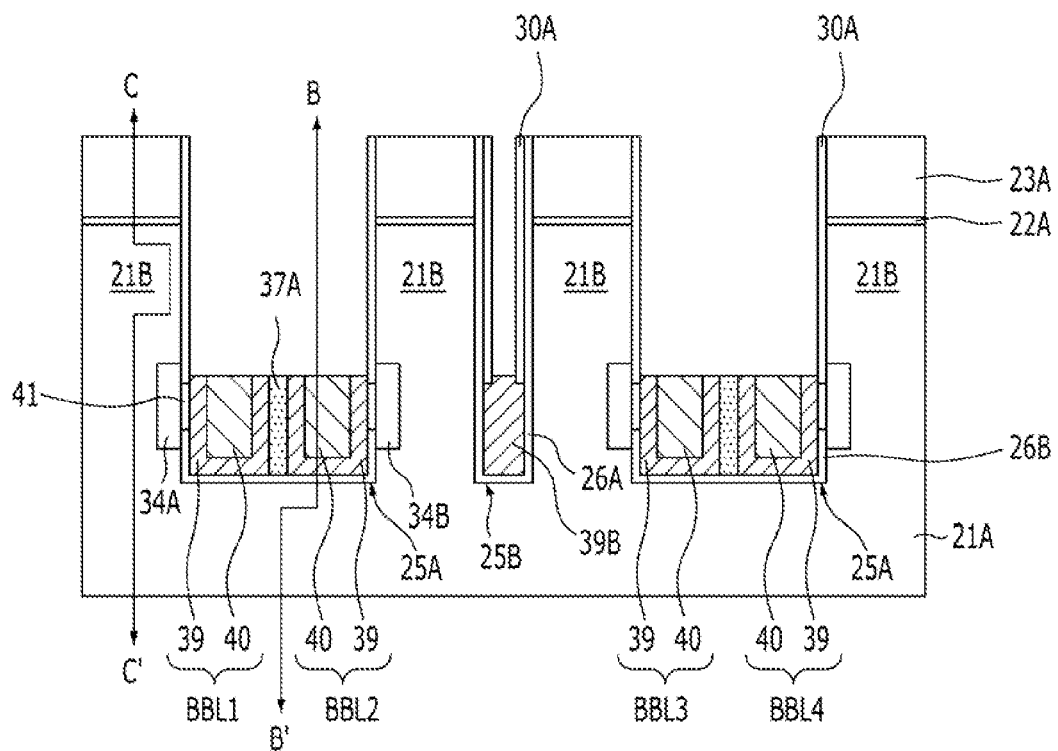

FIGS. 3A to 3Q are cross-sectional views illustrating the processes of a method for fabricating a semiconductor device in accordance with another embodiment of the present invention.

Referring to FIG. 3A, a pad layer 22 is formed on a substrate 21. The substrate 21 includes a silicon substrate. The pad layer 22 includes an oxide layer.

A hard mask layer 23 is formed on the pad layer 22. The hard mask layer 23 includes a nitride layer. As the hard mask layer 23, a nitride layer, an oxide layer, a carbon layer, and a silicon oxynitride layer (SiON) may be deposited in that order.

First photoresist patterns 24 are formed on the hard mask layer 23. The first photoresist patterns 24 are patterned in a line-space type. The first photoresist patterns 24 are also called a BBL (buried bit line) mask. The first photoresist patterns 24 have first spaces S1 and a second space S2. The first space S1 has a width greater than that of the second space S2. In the first photoresist patterns 24, the first spaces S1 and the second spaces S2, which have different widths, are alternately present. The first photoresist patterns 24 have the same line width L.

Referring to FIG. 3B, the hard mask layer 23 and the pad layer 22 are sequentially etched using the first photoresist patterns 24 as an etch barrier. Thus pad patterns 22A and hard mask patterns 23A are formed. The hard mask patterns 23A and the pad patterns 22A are patterned in a line-space type.

The first photoresist patterns 24 are then striped.

The substrate 21 is etched to a desired depth, using the hard mask patterns 23A as an etch barrier. Accordingly, first trenches 25A and a second trench 25B are defined. A plurality of active regions 21B are separated from one another by the first trenches 25A and the second trenches 25B. The substrate 21 which is formed with the active regions 21B is denoted by the reference numeral 21A. As a result, the plurality of active regions 21B are formed on the substrate 21A and are separated from one another by the first trenches 25A and the second trenches 25B. Each active region 21B has a first sidewall W1 and a second sidewall W2.

The active regions 21B form line patterns, and the first and second trenches 25A and 25B form space patterns. Thus, the first photoresist patterns 24 are transferred to the substrate 21A, where the first trenches 25A have the width of the first space S1, and the second trenches 25B have the width of the second space S2. Here, the first space S1 has a width greater than that of the second space S2. Since the lines L of the first photoresist patterns 24 are transferred to the plurality of active regions 21B, the active regions 21B have a width corresponding to that of the lines L, where the active regions 21B have the same width.

As described above, the plurality of active regions 21B are separated from one another by alternating ones of the first trenches 25A and the second trench 25B, where the second trench 25B has the width smaller than that of the first trenches 25A.

In an etching process for defining the first and second trenches 25A and 25B, anisotropic etching may be performed. Since the substrate 21 may be a silicon substrate, the anisotropic etching may be performed through plasma dry etching by solely using $Cl_2$ or HBr gas or mixedly using these gases.

Referring to FIG. 3C, a first liner layer 26 is formed on the overall surface of the resultant substrate 21A including the active regions 21B. The first liner layer 26 includes a nitride layer. Alternatively, as the first liner layer 26, an oxide layer and a nitride layer may be sequentially deposited.

A first sacrificial layer 27 is formed on the first liner layer 26 to gapfill the first trenches 25A and the second trench 25B. The first sacrificial layer 27 is a material which is removed after performing subsequent processes. For example, the first sacrificial layer 27 includes an undoped polysilicon layer. By using the undoped polysilicon layer, superior gapfill characteristics for the first and second trenches 25A and 25B may be achieved.

Referring to FIG. 3D, the first sacrificial layer 27 is planarized. The planarization may be performed through chemical mechanical polishing (CMP). The CMP is performed until the hard mask patterns 23A are exposed. Thus, first planarized sacrificial layers 27A and 27B are formed. The first planarzed sacrificial layer 27A gapfills the first trenches 25A which have the larger width. The other first planarized sacrificial layer 27B gapfills the second trenches 25B, which have the smaller width than the first trenches. While performing the CMP, the first liner layer 26 on the hard mask patterns 23a are removed as well. Accordingly, a first liner layer 26A is formed on, for example, the surfaces of the first and second trenches 25A and 25B only.

Referring to FIG. 3E, by applying, exposing and developing a photoresist layer, second photoresist patterns 28 are formed. The second photoresist patterns 28 include line-space patterns. Each of the second photoresist patterns 28 covers the first planarized sacrificial layer 27B which gapfills the second trench 25B. Furthermore, both sides of the second photoresist pattern 28 are aligned with the surfaces of the hard mask patterns 23A. The second photoresist patterns 28 define spaces which have a width greater than that of the first trenches 25A. Hence, the first planarized sacrificial layer 27A which remains in the first trenches 25A are opened in the second photoresist patterns 28.

The first planarized sacrificial layer 27A, which gapfills the first trenches 25A, is partially recessed by using the second photoresist patterns 28 as an etch barrier. Accordingly, first sacrificial patterns 27C are formed with a desired height, and first recesses 101 are defined on the first sacrificial patterns 27C. Wet etching may be employed to define the first recesses 101.

The first liner layer 26A which is formed on the side walls of the first trenches 25A is selectively removed. Accordingly, first liner patterns 26B are formed. Wet etching may be employed to form the first liner patterns 26B.

The first planarized sacrificial layer 27B and the first liner layer 26A still remain in the second trench 25B.

As apparent from the above descriptions, the first sacrificial patterns 27C define the first recesses 101 each of which exposes a sidewall of each active region 21B to a desired height. A sidewall may be any one of the first sidewall W1 and the second sidewall W2. In two active regions 21B which are separated by the first trench 25A, the left active region 21B is exposed on the first sidewall W1 thereof, and the right active region 21B is exposed on the second sidewall W2 thereof.

Referring to FIG. 3F, the second photoresist patterns 28 are removed.

A second sacrificial layer 29 is then formed. The second sacrificial layer 29 is formed on the overall surface of the resultant substrate 21A until the first recesses 101 defined on the first sacrificial patterns 27C are completely gapfilled. The second sacrificial layer 29 is removed after subsequent processes are performed. According to an example, the second sacrificial layer 29 includes an undoped polysilicon layer. All of the second sacrificial layer 29, the recessed first sacrificial patterns 27C, and the first planarized sacrificial layer 27B may include undoped polysilicon layers.

Referring to FIG. 3G, the second sacrificial layer 29 is partially recessed. The partial recessing is performed through etch-back. At this time, the first planarized sacrificial layer 27B which gapfills the second trench 25B is etched back as well.

By partially recessing the second sacrificial layer 29 in this way, second sacrificial patterns 29A are formed in the first trenches 25A. The second sacrificial patterns 29A cover the first sacrificial patterns 27C. A first sacrificial pattern 27D remains in the second trench 25B. Second recesses 102 are defined on the second sacrificial patterns 29A.

Referring to FIG. 3H, a second liner layer 30 is formed on the overall surface of the resultant substrate 21A including the second sacrificial patterns 29A. The second liner layer 30 includes a nitride layer.

Referring to FIG. 3I, by selectively etching the second liner layer 30, second liner patterns 30A are formed. The second liner patterns 30A have a spacer shape.

The second sacrificial patterns 29A and the first sacrificial patterns 27C and 27D are removed. Accordingly, first contact zones 31A and second contact zones 31B are defined to each expose a portion of a sidewall of each active region 21B, A sidewall may be any one of the first sidewall W1 and the second sidewall W2. According to an example, in the two active regions 21B separated by the first trench 25A, a portion of the first sidewall W1 is exposed by the first contact zone 31A, and a portion of the second sidewall W2 is exposed by the second contact zone 31B. The sidewalls of the active regions 21B which face each other across the second trench 25B are not exposed for making a contact zone due to the presence of the first liner layer 26A. The first sidewall W1 and the second sidewall W2 of the active regions 21B also define sidewalls of the first trench 25A. Thus, the first contact zone 34A exposes a portion of a sidewall (the first sidewall W1) of the first trench 25A, and the second contact zone 34B exposes a portion of the other sidewall (the second sidewall W2) of the first trench 25A.

Referring to FIG. 3J, a dopant supply layer 32 is formed on the overall surface of the resultant substrate 21A to fill the first and second trenches 25A and 25B defined between the active regions 21B. The dopant supply layer 32 is doped with a dopant. For example, the dopant supply layer 32 includes a dielectric layer or a doped polysilicon layer. The dielectric layer may include a PSG (phosphorous silicate glass) layer which has superior flow characteristics and is doped with a dopant to reach a desired dopant concentration. The dopant which is doped into the dopant supply layer 32 may contain an N-type dopant such as phosphorous (P). The dopant supply layer 32 may be formed through chemical vapor deposition (CVD).

Annealing 33 is then performed. At this time, the dopant which is doped into the dopant supply layer 32 diffuses into a sidewall of each of the active regions 21B which are exposed through the first contact zones 31A and the second contact zones 31B. Accordingly, first junctions 34A and second junctions 34B are formed. The first junctions 34A are formed in the active regions 21B which are exposed through the first contact zones 31A. The second junctions 34B are formed in the active regions 21B which are exposed through the second contact zones 31B.

When the dopant doped into the dopant supply layer 32 is an N-type dopant, the first and second junctions 34A and 34B include N-type junctions.

The annealing 33 may be performed in a furnace, and an annealing temperature may be set to approximately 500° C. to approximately 1,200° C.

In this way, in forming the first junctions 34A and the second junctions 34B through the formation of the dopant supply layer 32 and the thermal diffusion by performing the annealing 33, a doping depth and a dopant concentration may be easily controlled. The first junctions 34A and the second junctions 34B, which are formed on the portions of the sidewalls of the active regions 21B, are formed on the portions of both sidewalls of the first trenches 25A.

Referring to FIG. 3K, the dopant supply layer 32 is removed. The dopant supply layer 32 may be removed through wet etching or dry etching.

A third sacrificial layer 35 is then formed. The third sacrificial layer 35 may include an oxide layer. The third sacrificial layer 35 has a thickness that gapfills the second trench 25B. According to an example, the first trenches 25A are not completely gapfilled by the third sacrificial layer 35.

Referring to FIG. 3L, the third sacrificial layer 35 is selectively etched. This is called spacer etching. Third sacrificial patterns 35A and 35B are formed after the spacer etching. While the third sacrificial pattern 35B which remains in the second trench 25B does not have a spacer shape, the third sacrificial patterns 35A which remain in the first trenches 25A have spacer shapes. Hereinbelow, the third sacrificial patterns 35A which remain in the first trenches 25A will be simply referred to as spacers 35A. Separation trenches 36 are defined by such spacers 35A.

Referring to FIG. 3M, separation layers 37 are buried into the separation trenches 36. The separation layers 37 may include a nitride layer. The separation layers 37 may be formed by depositing a nitride layer on the overall surface of the resultant substrate 21A to gapfill the separation trenches 36 and etching back the excess nitride layer. Each of the separation layers 37 has a shape which vertically extends from the bottom surface of each first trench 25A.

As a consequence, the first trench 25A is divided by the separation layer 37.

Referring to FIG. 3N, the spacers 35A and the third sacrificial pattern 35B are removed. Since the spacers 35A and the third sacrificial pattern 35B include the oxide layer and the separation layers 37 include the nitride layer, the spacers 35A and the third sacrificial pattern 35B may be removed selectively without the loss of the separation layers 37.

By removing the spacers 35A and the third sacrificial pattern 35B in this way, two burying trenches 38A and 38B are defined in each first trench 25A. The two burying trenches 38A and 38B are separated by the separation layer 37.

Referring to FIG. 3O, a barrier metal 39 and a metal layer 40 are sequentially formed on the overall surface of the resultant substrate 21A including the burying trenches 38A and 38B. The barrier metal 39 includes a titanium (Ti) layer and a titanium nitride (TiN) layer. The metal layer 40 includes a tungsten layer. The barrier metal 39 has a thickness that completely fills the second trench 25B. Thus, the metal layer 40 is not formed in the second trench 25B. After the barrier metal 39 is formed, the burying trenches 38A and 38B are filled with the metal layer 40. After forming the barrier metal 39, side contacts 41 may be formed. The side contacts 41 create ohmic contacts between buried bit lines to be subsequently formed and the first and second junctions 34A and 34B. The side contacts 41 according to an example include a metal silicide layer. In the case where the barrier metal 39 is a metallic material which includes titanium, the side contacts 41 include a titanium silicide layer. In order to form the titanium silicide layer, annealing may be performed after depositing the barrier metal 39, and thereafter, the metal layer 40 is deposited.

Referring to FIG. 3P, the barrier metal 39 and the metal layer 40 are selectively etched until the hard mask patterns 23A are exposed. This is referred to as a bit line separation process.

By performing the bit line separation process, preliminary buried bit lines 103A and 103B are formed in such a way as to be buried in the burying trenches 38A and 38B. Each of the respective preliminary buried bit lines 103A and 103B have a double-layered structure including the barrier metal 39 and the metal layer 40.

Because the two burying trenches 38A and 38B in the first trench 25A are separated from each other by the separation layer 37, the two preliminary buried bit lines 103A and 103B are simultaneously formed in the first trench 25A. Accordingly, these adjoining preliminary buried bit lines 103A and 103B are insulated and isolated from each other by the separation layer 37. A dummy line 39A is formed in the second trench 25B. The dummy line 39A is formed by the barrier metal 39. The dummy line 39A is not electrically connected with the active region 21B.

In succession, referring to FIG. 3Q, the preliminary buried bit lines 103A and 103B are recessed to have a height that approaches that of the side contacts 41. Accordingly, buried bit lines BBL1 to BBL4 are formed. In the second trench 25B, the dummy line 39A is simultaneously recessed and is denoted by the reference numeral 39B. The separation layers 37 are also recessed and are denoted by the reference numeral 37A to have the same height as the buried bit lines BBL1 to BBL4.

As a result, two pairs of buried bit lines BBL1 and BBL2, and BBL3 and BBL4 are formed in the respective first trenches 25A. Each pair of buried bit lines are separated from each other by the separation layer 37A.

FIGS. 4A to 4E are cross-sectional views illustrating the subsequent processes of the method after forming buried bit lines. FIGS. 4A to 4E are cross-sectional views of the semiconductor device along the lines B-B' and C-C' in FIG. 3Q.

Figure 4A:
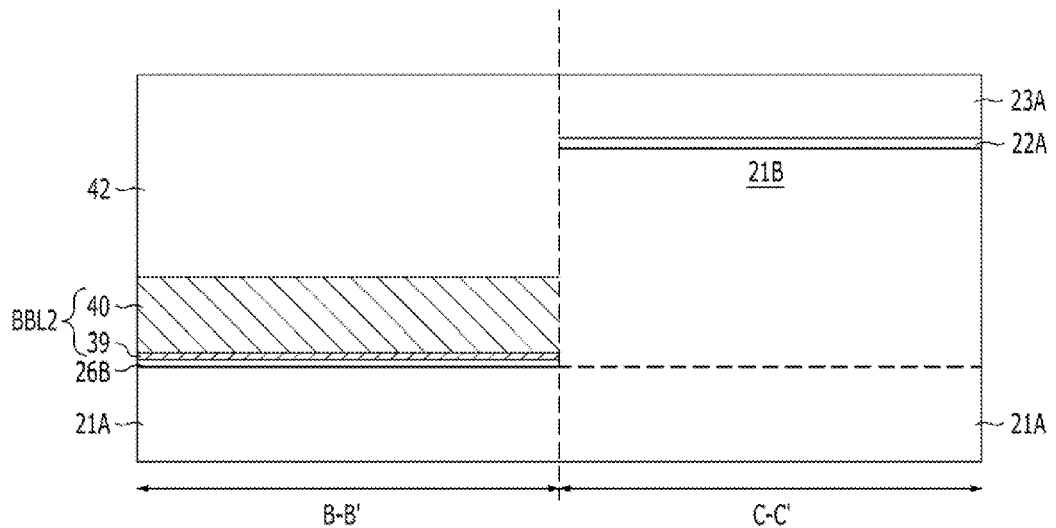
FIGS. 4A to 4E are cross-sectional views illustrating the subsequent processes of the method after forming buried bit lines.

Referring to FIG. 4A, a first interlayer dielectric layer 42 is formed on the overall surface of the resultant substrate 21A including the buried bit line BBL2. The first interlayer dielectric layer 42 is planarized until the surfaces of the hard mask patterns 23A are exposed.

Figure 4B:
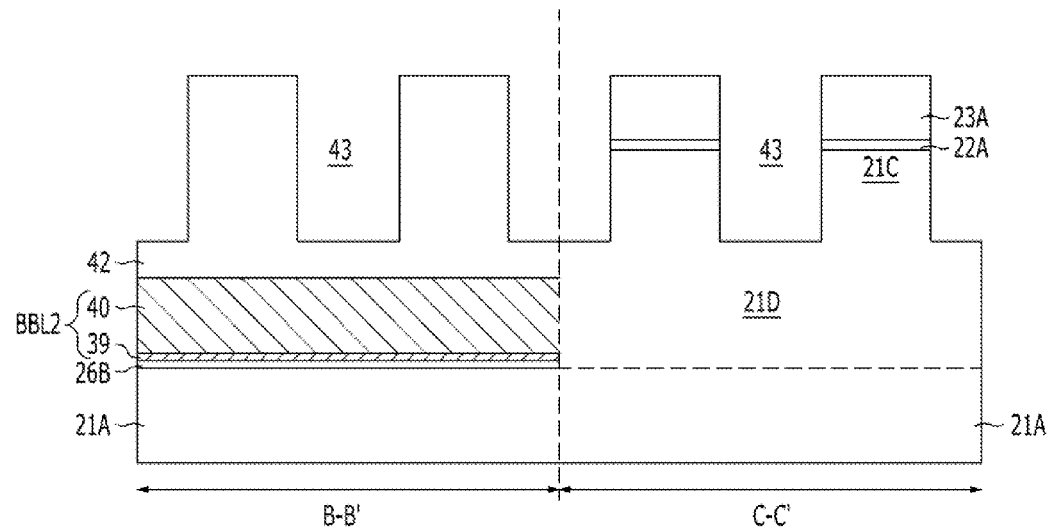

Referring to FIG. 4B, word line trenches 43 are defined. In order to define the word line trenches 43 photoresist patterns which are not shown in the drawings are formed. The first interlayer dielectric layer 42 is etched to a desired depth, using the photoresist patterns as an etch barrier. When etching the first interlayer dielectric layer 42, the hard mask patterns 23A, the pad patterns 22A and the active regions 21B are etched to the desired depth. As a consequence, active pillars 21C are formed on the substrate 21A, and an active body 21D is formed under the active pillars 21C. The first and second junctions 34A and 34B are formed in the active body 21D. The active body 21D has the shape of a line which extends in the same direction as the buried bit line BBL2. The active pillars 21C have the pillar-like shapes which extend vertically on the active body 21D. The remaining first interlayer dielectric layer 42 in height serves as a separation layer between the buried bit line BBL2 and word lines.

Figure 4C:
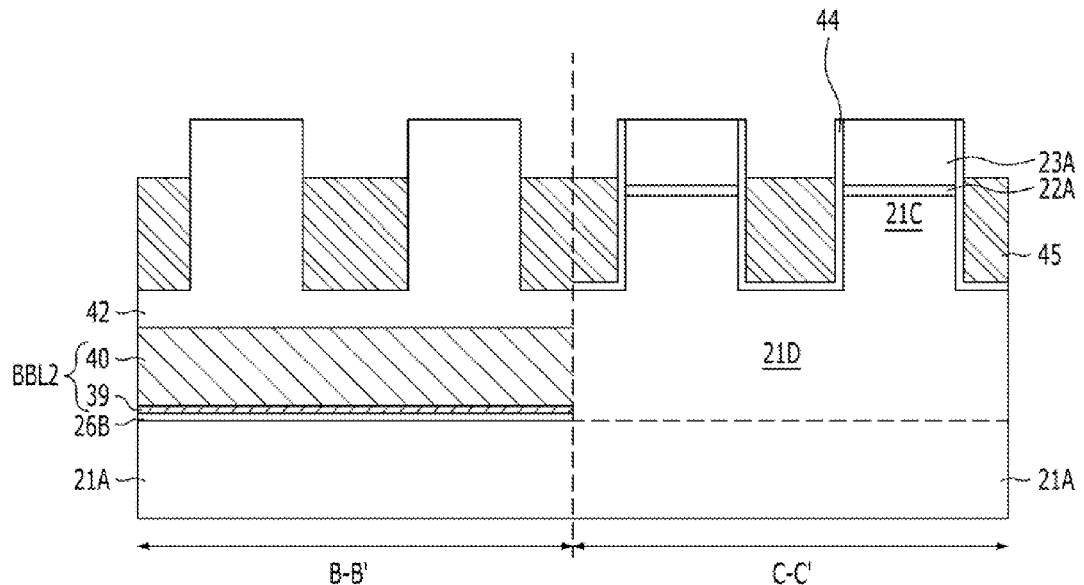

Referring to FIG. 4C, a word line conductive layer 45 is formed to fill the word line trenches 43. Thereafter, by performing planarization and etch-back, the word line conductive layer 45 is left to a height that partially fills the word line trenches 43. Before forming the word line conductive layer 45, a gate dielectric layer 44 may be formed.

Figure 4D:
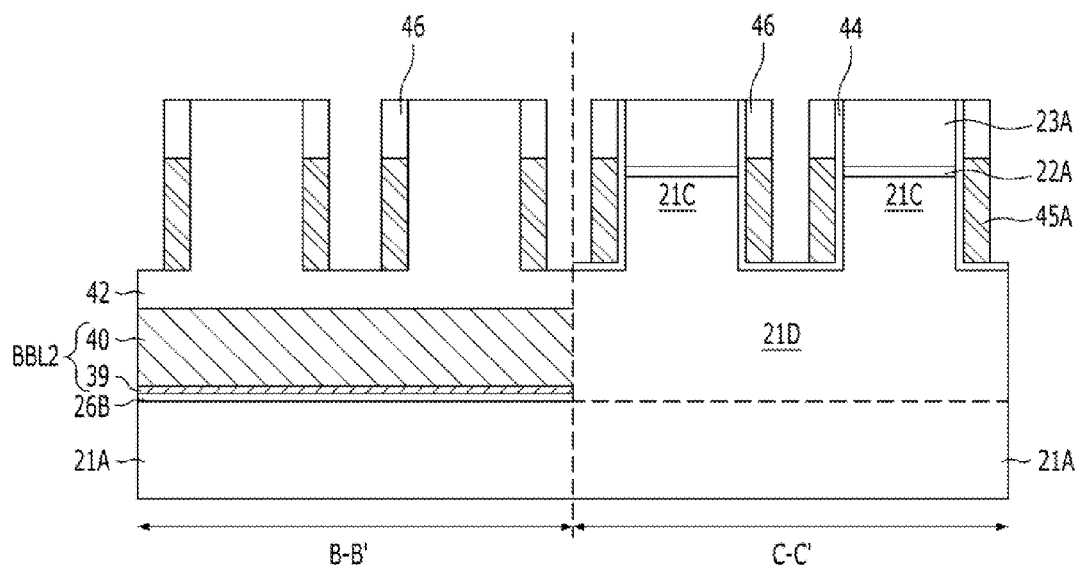

Referring to FIG. 4D, after forming spacers 46, the word line conductive layer 45 is etched using the spacers 46 as an etch barrier. Accordingly, word lines 45A are formed to contact both sidewalls of the active pillars 21C.

Figure 4E:
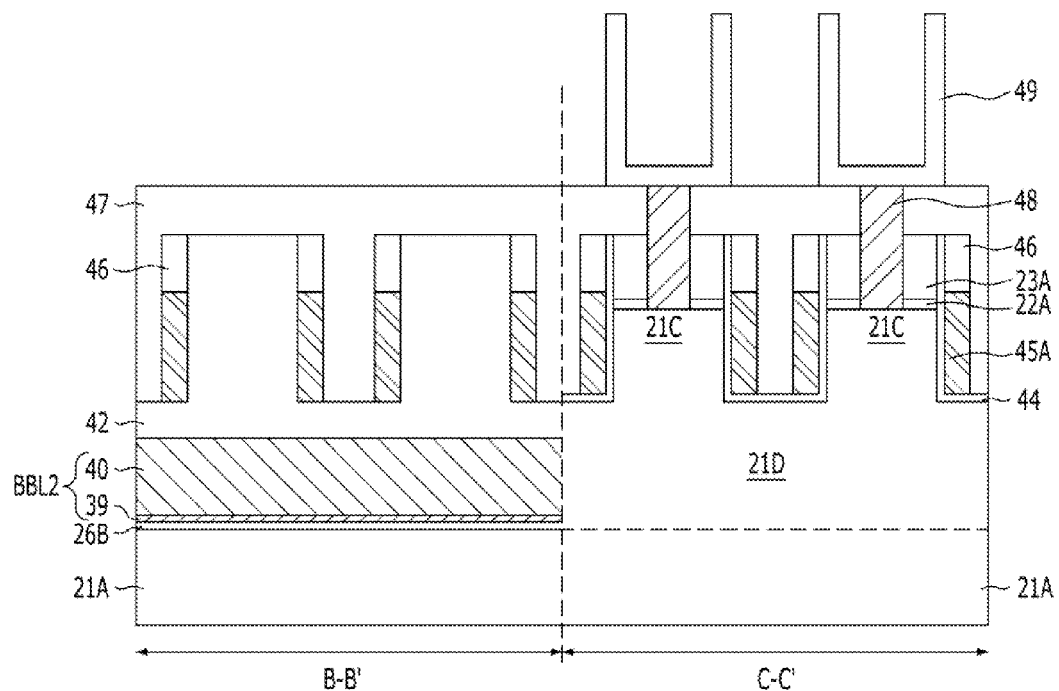

Referring to FIG. 4E, a second interlayer dielectric layer 47 is formed on the overall surface of the resultant substrate 21A including the word lines 45A.

By performing storage node contact etching, the upper surfaces of the active pillars 21C are exposed. Storage node contact plugs 48 are formed.

Storage nodes 49 are formed on the storage node contact plugs 48. Each of the storage nodes 49 may have the shape of a cylinder. In another embodiment, the storage node 49 may have a flat plate shape or a concave shape. A dielectric layer and top electrodes are subsequently formed.

The semiconductor device in accordance with the above-described embodiments of the present invention may be applied to cells which have $4F^2$ structures.

As apparent from the above description, in the exemplary embodiments of the present invention, due to the fact that junctions are formed after simultaneously exposing a portion of a sidewall of each of adjoining active regions, the depth of the junctions may be uniform.

Also, since contact zones where the junctions are to be formed are exposed through recessing liner layers and sacrificial layers, processing difficulties may be reduced and the margin of a mask process may be secured. Accordingly, side contacts and the junctions may be uniformly formed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of active regions separated by alternating first and second trenches, wherein the second trenches have a width smaller than that of the first trenches;
   a separation layer dividing the first trench; and
   buried bit lines buried in the first trench with the separation layer interposed between the buried bit lines.

2. The semiconductor device of claim 1, further comprising:
   a junction formed on each sidewall of the active regions and connected with a respective one of the buried bit lines; and
   a side contact formed between each of the junctions and a respective one of the buried bit lines.

3. The semiconductor device of claim 2, further comprising:
   a liner layer having contact zones which expose portions of sidewalls of the active regions,
   wherein the side contacts are buried in the respective contact zones and are connected with the respective junctions.

4. The semiconductor device of claim 1, wherein the separation layer comprises a dielectric layer.

5. The semiconductor device of claim 1, wherein the separation layer comprises a nitride layer.

6. The semiconductor device of claim 1, wherein the separation layer has a shape which extends vertically from a bottom surface of the trench.

7. A semiconductor device comprising:
   a plurality of active regions separated by alternating ones of first trenches and second trenches, wherein the second trenches have a width smaller than that of the first trenches;
   separation layers for dividing the first trenches, respectively;
   buried bit lines buried in each of the first trenches with the separation layers interposed between the bit lines of the trench; and
   junctions formed in the active regions and connected with the buried bit lines.

8. The semiconductor device of claim 7, further comprising:
   side contacts formed between the respective buried bit lines and the respective junctions.

9. The semiconductor device of claim 7, wherein each of the separation layers has a shape which extends vertically from a bottom surface of the each of the first trenches.

10. The semiconductor device of claim 7, wherein the separation layers comprise a dielectric layer.

11. The semiconductor device of claim 7, wherein the separation layers comprise a nitride layer.

12. The semiconductor device of claim 7, further comprising:
    a liner layer having contact zones which expose portions of sidewalls of the first trench,
    wherein side contacts are buried in the respective contact zones and are connected with the respective junctions.

13. The semiconductor device of claim 7, wherein each of the active regions comprises a silicon pillar which has a first sidewall and a second sidewall, and each of the junctions is formed on a portion of a sidewall of the silicon pillar.

14. The semiconductor device of claim 7, further comprising:
    a liner layer formed over a surface of each second trench; and
    a dummy line filling each second trench over the liner layer.

15. The semiconductor device of claim 14, wherein the dummy line is not electrically connected with the active regions through the liner layer.

\* \* \* \* \*